(12) United States Patent
Zhao et al.

(10) Patent No.: US 12,510,781 B2
(45) Date of Patent: Dec. 30, 2025

(54) BACKLIGHT MODULE AND DISPLAY DEVICE

(71) Applicants: Hefei BOE Optoelectronics Technology Co., Ltd., Anhui (CN); BOE Technology Group Co. Ltd., Beijing (CN)

(72) Inventors: Xuemei Zhao, Beijing (CN); Douqing Zhang, Beijing (CN); Hu Li, Beijing (CN); Bangmin Chen, Beijing (CN); Xiuchen Shao, Beijing (CN); Yangyang Lei, Beijing (CN); Dengling Xie, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/681,879

(22) PCT Filed: Mar. 31, 2022

(86) PCT No.: PCT/CN2022/084533
§ 371 (c)(1),
(2) Date: Feb. 7, 2024

(87) PCT Pub. No.: WO2023/184388
PCT Pub. Date: Oct. 5, 2023

(65) Prior Publication Data
US 2025/0138367 A1    May 1, 2025

(51) Int. Cl.
*G02F 1/00* (2006.01)
*G02F 1/13357* (2006.01)

(52) U.S. Cl.
CPC .. *G02F 1/133605* (2013.01); *G02F 1/133603* (2013.01)

(58) Field of Classification Search
None
See application file for complete search history.

(56) References Cited

U.S. PATENT DOCUMENTS

2009/0152582 A1* 6/2009 Chang .............. H10H 20/853
257/E33.061
2010/0066229 A1* 3/2010 Hamby ............ H01L 25/0753
313/1

(Continued)

FOREIGN PATENT DOCUMENTS

CN        2751328 Y    1/2006
CN      201992470 U    9/2011

(Continued)

OTHER PUBLICATIONS

International Search Report of PCT application No. PCT/CN2022/084533 dated Nov. 29, 2022.

(Continued)

*Primary Examiner* — Gerald J Sufleta, II
(74) *Attorney, Agent, or Firm* — Calfee, Halter & Griswold LLP

(57) ABSTRACT

A backlight module and a display device are provided. The backlight module includes: a circuit board, a plurality of light-emitting units and a microstructure film layer, the plurality of light-emitting units being distributed in an array on the circuit board, the plurality of light-emitting units forming a plurality of light-emitting unit groups, each light-emitting unit group including at least one light-emitting unit, the microstructure film layer being located on the circuit board and located on the same side of the circuit board as the light-emitting units, first opening holes corresponding to the light-emitting unit groups being formed in the microstructure film layer, the light-emitting unit groups being located in the first opening holes corresponding thereto; the microstructure film layer including reflection walls surrounding (Continued)

the first opening holes, and the reflection walls being configured for reflecting light emitted by the light-emitting unit groups surrounded thereby.

17 Claims, 9 Drawing Sheets

(56) References Cited

U.S. PATENT DOCUMENTS

| | | |
|---|---|---|
| 2019/0049762 A1 | 2/2019 | Yonemoto et al. |
| 2021/0074693 A1* | 3/2021 | Sim .................. G02F 1/133603 |
| 2021/0302785 A1* | 9/2021 | Nam ................ G02F 1/133621 |
| 2021/0367126 A1* | 11/2021 | Hong ................ H10H 20/858 |
| 2022/0252938 A1* | 8/2022 | Lo .................... G02F 1/133603 |

FOREIGN PATENT DOCUMENTS

| | | |
|---|---|---|
| CN | 103562622 A | 2/2014 |
| CN | 105319773 A | 2/2016 |
| CN | 105717571 A | 6/2016 |
| CN | 109073172 A | 12/2018 |
| CN | 111208671 A | 5/2020 |
| CN | 113064301 A | 7/2021 |
| CN | 113448122 A | 9/2021 |

OTHER PUBLICATIONS

Written Opinion of PCT application No. PCT/CN2022/084533 dated Nov. 29, 2022

* cited by examiner

BACKLIGHT MODULE AND DISPLAY DEVICE

CROSS REFERENCE TO RELATED APPLICATIONS

The present disclosure is the U.S. national phase application of International Application No. PCT/CN2022/084533 filed on Mar. 31, 2022, the content of which is incorporated herein by reference in its entirety for all purposes.

TECHNICAL FIELD

The present disclosure relates to the field of display technology, in particular to a backlight module and a display device.

BACKGROUND

In the related art, Mini LED display technology forms a backlight for a liquid crystal display device through mini LEDs (submillimeter light-emitting diode). A display effect being of high contrast, wide color gamut, and high brightness can be achieved, by controlling the brightness of different backlight regions.

It should be noted that the information disclosed in the above section is only intended to enhance the understanding of the background of the present disclosure, and thus can include information that does not constitute the prior art already known to those skilled in the art.

SUMMARY

According to one aspect of the present disclosure, a backlight module is provided, and the backlight module includes a circuit board, multiple light-emitting units arranged in an array on the circuit board, wherein the multiple light-emitting units form multiple light-emitting unit groups, and each of the light-emitting unit groups includes at least one light-emitting unit; and a microstructure film layer located on the circuit board and on the same side as the light-emitting units on the circuit board, wherein first opening holes corresponding to the light-emitting unit groups are formed in the microstructure film layer, and the light-emitting unit group is located within a first opening hole corresponding thereto; and wherein the microstructure film layer includes a reflection wall surrounding the first opening hole, and the reflection wall is configured to reflect light emitted by the light-emitting unit group surrounded by the reflection wall.

In some embodiments of the present disclosure, the microstructure film layer includes a foamed reflection layer located on the circuit board and on the same side as the light-emitting units on the circuit board, wherein second opening holes corresponding to the light-emitting unit groups are formed on the foamed reflection layer, the light-emitting unit group is located within a second opening hole corresponding thereto, and a sidewall of the second opening hole forms the reflection wall.

In some embodiments of the present disclosure, the microstructure film layer further includes a first wavelength conversion layer configured to convert a wavelength of light passing through the first wavelength conversion layer, and the first wavelength conversion layer conformally covers the sidewall of the second opening hole.

In some embodiments of the present disclosure, the microstructure film layer further includes a transparent protection layer conformally covering a side of the first wavelength conversion layer away from the foamed reflection layer.

In some embodiments of the present disclosure, the second opening hole includes a gradually-varied extension section, wherein an area of the opening hole on a side where the gradually-varied extension section is away from the circuit board is greater than an area of the opening hole on a side where the gradually-varied extension section is close to the circuit board.

In some embodiments of the present disclosure, a sidewall of the gradually-varied extension section forms a curved surface, and a tangent at any position on the sidewall of the gradually-varied extension section is located on a side of the sidewall of the gradually-varied extension section facing towards the circuit board.

In some embodiments of the present disclosure, a groove is formed on a side of the foamed reflection layer facing towards the circuit board.

In some embodiments of the present disclosure, an area of a groove opening where the groove faces towards the circuit board is greater than an area of a groove opening where the groove is away from a side of the circuit board; and an orthographic projection of a sidewall of the groove on the circuit board intersects with an orthographic projection of a sidewall of the gradually-varied extension section on the circuit board.

In some embodiments of the present disclosure, the sidewall of the groove forms a curved surface, and a tangent at any position on the sidewall of the groove is located on a side of the sidewall of the groove facing towards the circuit board.

In some embodiments of the present disclosure, a maximum thickness of the foamed reflection layer between the sidewall of the groove and the sidewall of the gradually-varied extension section is X, a minimum thickness of the foamed reflection layer between the sidewall of the groove and the sidewall of the gradually-varied extension section is Y, and $(X-Y)/Y$ is greater than or equal to 0 and less than or equal to 1.8.

In some embodiments of the present disclosure, the first opening hole includes a first opening on a side facing away from the circuit board and a second opening on a side facing towards the circuit board, the first opening is any one of circular, polygonal, or elliptical shapes, and the second opening is any one of circular, polygonal, or elliptical shapes.

In some embodiments of the present disclosure, the multiple light-emitting units are arranged in evenly spaced manner in an array in a first direction and a second direction, the first direction intersects with the second direction; the first opening is of a quadrilateral shape, the first opening includes a first side edge and a second side edge intersecting with each other, the first side edge is parallel to the first direction, the second side edge is parallel to the second direction, and multiple first openings are arranged in an array along the first direction and the second direction.

In some embodiments of the present disclosure, adjacent side edges of two adjacent first openings in the first direction coincide with each other, and adjacent side edges in the second direction coincide with each other.

In some embodiments of the present disclosure, the gradually-varied extension section includes a third opening on a side facing away from the circuit board and a fourth opening on a side facing towards the circuit board, a distance between the third opening and the fourth opening in a direction perpendicular to the circuit board is S2; a minimum distance between an edge of an orthographic projection of the third opening on the circuit board and an edge of an orthographic projection of the fourth opening on the circuit board in a first horizontal direction is S1, with the first horizontal direction passing through a centroid of the orthographic projection of the fourth opening on the circuit board; and wherein S1/S2 is greater than or equal to 1 and less than or equal to 4.

In some embodiments of the present disclosure, the light-emitting unit includes a light-emitting chip and a diffusion functional layer including a diffusion base material layer and diffusion particles located within the diffusion base material layer, wherein the diffusion functional layer forms an encapsulation on a side of the light-emitting chip away from the circuit board for diffusing light passing through the diffusion functional layer.

In some embodiments of the present disclosure, a thickness of the diffusion functional layer on a side where the diffusion functional layer is close to the circuit board is smaller than a thickness of the diffusion functional layer on a side where the diffusion functional layer is away from the circuit board.

In some embodiments of the present disclosure, a concentration of the diffusion particles on a side where the diffusion functional layer is close to the circuit board is lower than a concentration of the diffusion particles on a side where the diffusion functional layer is away from the circuit board.

In some embodiments of the present disclosure, the backlight module further includes a second wavelength conversion layer located on a side of the microstructure film layer away from the circuit board, and the light-emitting units are supported between the second wavelength conversion layer and the circuit board.

In some embodiments of the present disclosure, the backlight module further includes a second wavelength conversion layer located on a side of the microstructure film layer away from the circuit board, and there is a preset gap between the light-emitting units and the second wavelength conversion layer.

In some embodiments of the present disclosure, the microstructure film layer further includes: multiple reflection particles distributed on at least a portion of a reflection surface of the reflection wall, and configured for diffuse reflection of light surrounding the reflection wall emitted by the light-emitting unit group; wherein along a direction parallel to the circuit board and on the same reflection wall surrounding the light-emitting unit group, a distribution density of the reflection particles away from the light-emitting unit group is smaller than a distribution density of the reflection particles close to the light-emitting unit group.

In some embodiments of the present disclosure, a control circuit configured to independently control luminous intensity of the light-emitting unit groups.

According to one aspect of the present disclosure, a display device is provided, and the display device includes the backlight module as described above.

It should be understood that the general description above and the detailed description in the following are only illustrative and explanatory, and do not limit the present disclosure.

BRIEF DESCRIPTION OF THE DRAWINGS

The drawings, which are incorporated in and constitute a part of this specification, illustrate embodiments consistent with the present disclosure and serve together with the specification to explain principles of the present disclosure. It is apparent that the drawings in the following description are only some embodiments of the present disclosure, and for those of ordinary skill in the art, other drawings can also be obtained from these drawings without creative efforts.

DETAILED DESCRIPTION

Figure 1:
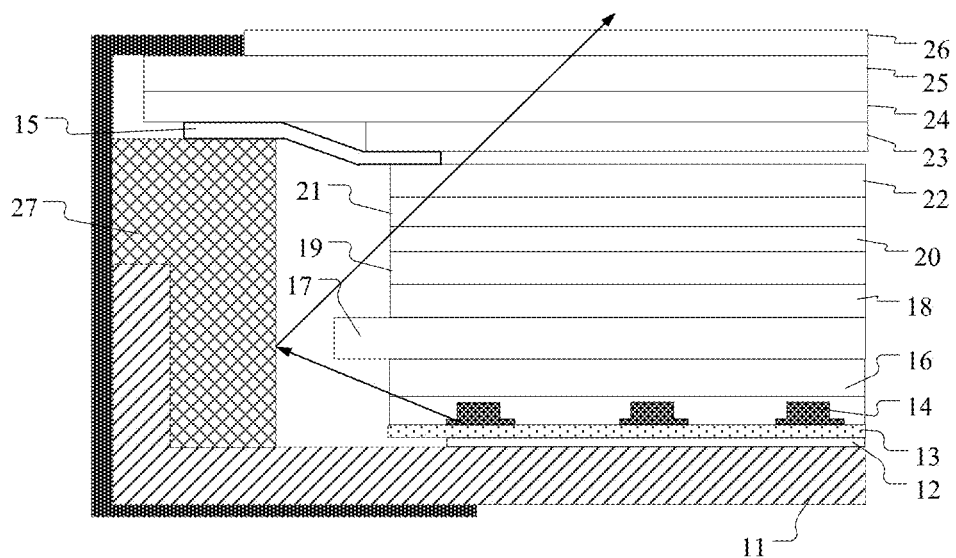
FIG. 1 is a schematic diagram of a structure of a display device in the related art.

Example embodiments will now be described more fully with reference to the drawings. Example embodiments, however, can be embodied in a variety of forms and should not be construed as being limited to examples set forth herein. Instead, these embodiments are provided so that the present disclosure will be thorough and complete, and will fully convey concepts of the example embodiments to those skilled in the art. The same reference numerals in the drawings represent the same or similar structures, and thus their detailed descriptions will be omitted.

Terms "one", "a", and "the" are used to indicate the existence of one or more elements/components/etc. Terms "include" and "has" are used to indicate open inclusion and refer to the existence of additional elements/components/etc. in addition to the listed ones.

As shown in FIG. 1, a schematic diagram of a structure of a display device in related art. The display device can include a backplane 11, double-sided glue 12, a circuit board 13, an LED chip 14, lamp glue 16, a wavelength conversion layer 17, a homogenizing film 18, a homogenizing film 19, a homogenizing film 20, a homogenizing film 21, a prism film 22, a first polarizer 23, an array substrate 24, a color film 25, a second polarizer 26, mouth glue 15, and a glue frame 27. The LED chip 14 forms the backlight of the display device. In the related art, the light emitted by the LED chip 14 is blue light, and the wavelength conversion layer 17 can convert the blue light passing through it to white light. However, as shown by the arrow in FIG. 1, the blue light emitted by the LED chip 14 located on an edge of the circuit board 13 can be reflected at the glue frame 27 and incident onto a light output side of the display device, which ultimately causes an edge of a display area of the display device to turn blue. In the related art, the blue edge problem is usually improved by providing a yellow glue frame 27, and adding fluorescent powder on edges of some films such as the mouth glue 15, the lamp glue 16, the wavelength conversion layer 17, the homogenizing film 18, the homogenizing film 19, the homogenizing film 20, the homogenizing film 21, the prism film 22, etc. However, the above method cannot solve the blue edge problem from the root cause.

Figure 2:
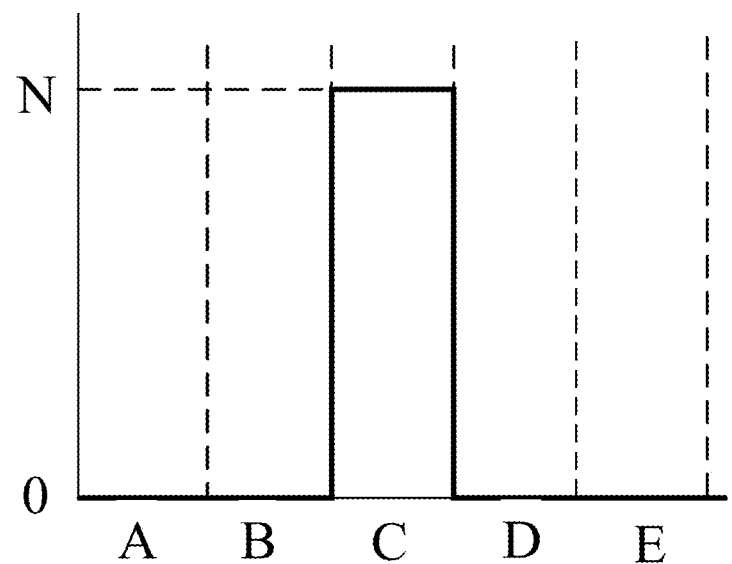
FIG. 2 shows display brightness of different backlight regions under an ideal condition.
Figure 3:
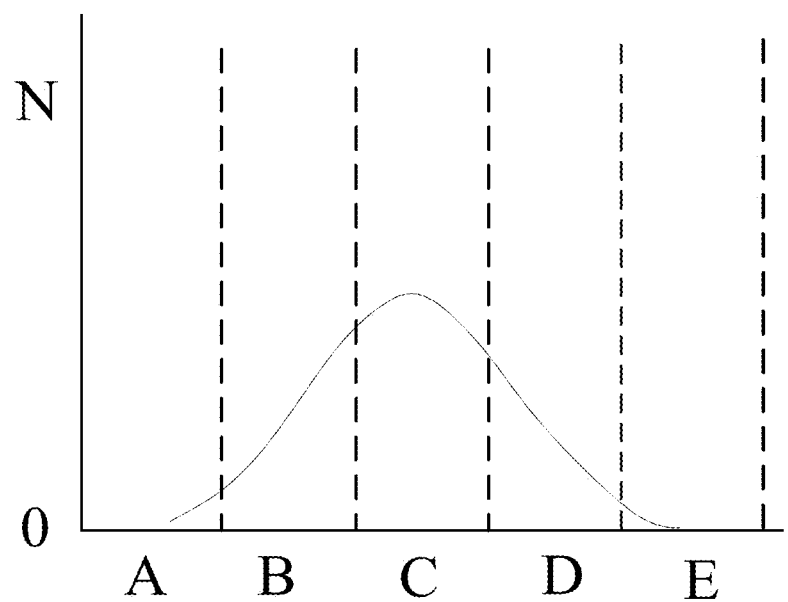
FIG. 3 shows display brightness of different backlight regions under an actual condition.
Figure 4:
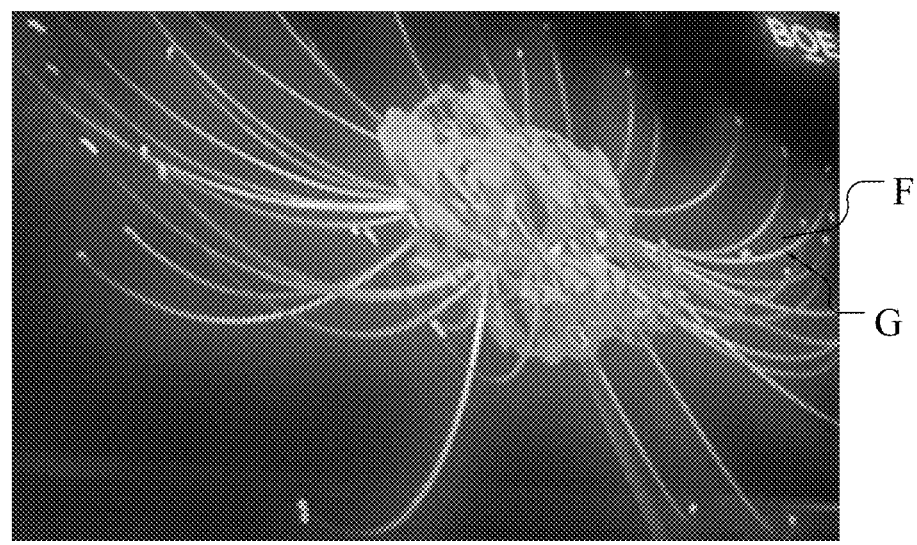
FIG. 4 shows an effect of a halo phenomenon.

In addition, in the display device, the control circuit in the circuit board 13 can drive the LED chips 14 in different regions to emit light of different brightness, so that the display device can achieve high contrast, wide color gamut, and high brightness. The display device can also achieve refined highlight dynamic rendering at the same time. However, when the brightness of different backlight regions is different, a backlight region being of high brightness will subject to light leakage to a backlight region being of low brightness, resulting in halo. As shown in FIGS. 2 and 3, the schematic diagram for explaining the halo generation is shown, where a horizontal axis represents adjacent regions A, B, C, D, and E in the backlight region, and a vertical axis represents the display brightness of different backlight regions. As shown in FIG. 2, the display brightness of different backlight regions under an ideal condition can be obtained. The display brightness of the region C is N, and the display brightness of regions A, B, D, and E are all 0. As shown in FIG. 3, the display brightness of different backlight regions under an actual condition can be obtained. Due to the light leakage from region C to regions A, B, D, and E, the originally black regions A, B, D, and E display in certain brightness, resulting in halo phenomenon. As shown in FIG. 4, the effect of the halo phenomenon is shown. A region F in FIG. 4 originally needed to display in black, but due to the light leakage from a region G to the region F, the region F displays in certain brightness.

Figure 5:
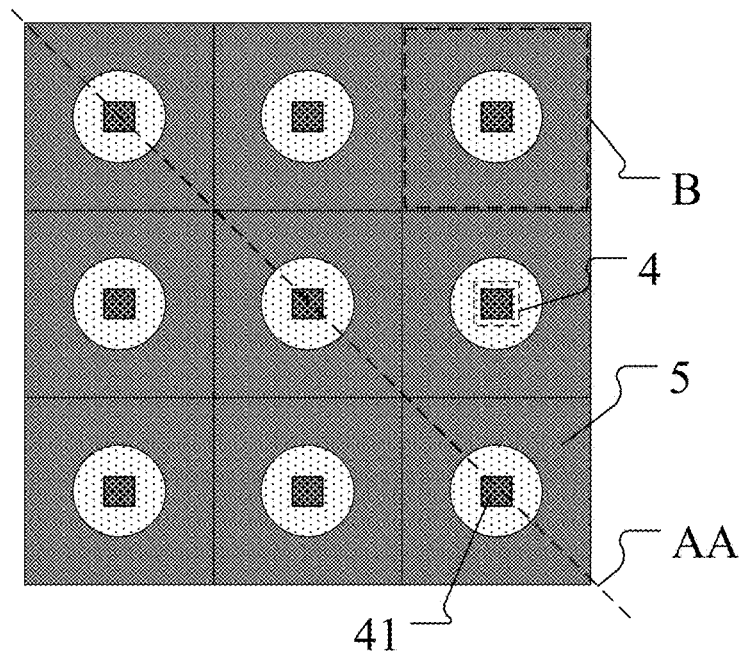
FIG. 5 is a front view of an example backlight module according to embodiments of the present disclosure.
Figure 6:
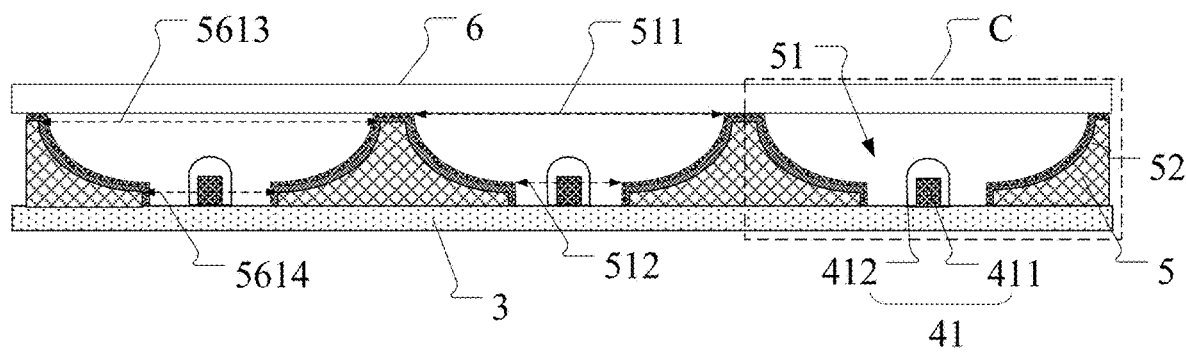
FIG. 6 is a sectional view of the backlight module shown in FIG. 5 along a dashed line AA.
Figure 7:
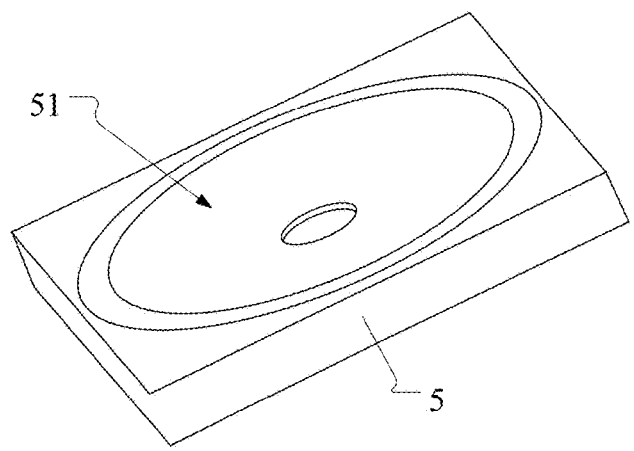
FIG. 7 is a three-dimensional view of a local region B of the backlight module shown in FIG. 5.

Embodiments of the present disclosure provide a backlight module, as shown in FIGS. 5, 6, and 7. FIG. 5 is a front view of an example backlight module according to embodiments of the present disclosure, FIG. 6 is a sectional view of the backlight module shown in FIG. 5 along a dashed line AA, and FIG. 7 is a three-dimensional view of a local region B of the backlight module shown in FIG. 5. In some embodiments, the backlight module can include a circuit board 3, multiple light-emitting units 41, and a microstructure film layer 5. The multiple light-emitting units 41 can be arranged in an array on the circuit board 3. The multiple light-emitting units 41 form multiple light-emitting unit groups 4, and each light-emitting unit group 4 can include at least one light-emitting unit 41. The microstructure film layer 5 is located on the circuit board 3 and is on the same side as the light-emitting units 41 on the circuit board 3. A first opening hole 51 corresponding to the light-emitting unit group 4 is formed in the microstructure film layer 5, and the light-emitting unit group 4 is located within the first opening hole 51 corresponding thereto. The microstructure film layer 5 includes a reflection wall 52 surrounding the first opening hole, which is configured to reflect the light emitted by the light-emitting unit group 4 surrounded therein.

In some embodiments, the reflection wall 52 can be configured to reflect the light emitted by the light-emitting unit group 4 surrounded in the first opening hole, so that the backlight regions where the light-emitting unit groups 4 are located are isolated into independent spaces by the reflection wall 52. The backlight region where each light-emitting unit group 4 is located will not leak light to other backlight regions, and the light-emitting units located at the edge of the circuit board 3 will not leak light to the edge of the display area of the display device. Therefore, the backlight module can improve the problem of halo of the display device and the color deviation of the edge of the display area.

In some embodiments, the light-emitting unit can emit light being of first color, and the light being of the first color can be blue light. As shown in FIG. 6, the backlight module can further include a second wavelength conversion layer 6, which can convert the light being of the first color into white light, enabling the backlight module to provide a white backlight source. In some embodiments, the second wavelength conversion layer 6 can be a quantum dot layer, a fluorescence layer, etc. The quantum dot layer can include a transparent base material and quantum dots encapsulated in the transparent base material. For example, in some embodiments, the quantum dot layer forming the second wavelength conversion layer can include red quantum dots and green quantum dots. The red quantum dots can generate red light under the excitation by the blue light, and the green quantum dots can generate green light under the excitation by the blue light. Therefore, the quantum dot layer including red quantum dots and green quantum dots can convert the blue light into the white light. In some embodiments, the fluorescent layer can include fluorescent materials that emit red light under the excitation and fluorescent materials that emit green light under the excitation.

In some embodiments, as shown in FIG. 6, the light-emitting unit 41 can include a light-emitting chip 411. The light-emitting chip 411 can be a submillimeter light-emitting diode with a size ranging from 50 to 200 μm. The circuit board can be a flexible circuit board, a printed circuit board, etc. A control circuit can be integrated on the circuit board to independently control the emission of each light-emitting unit group 4. That is, the control circuit can control each light-emitting unit group 4 to emit light being of the same or different brightness.

Figure 8:
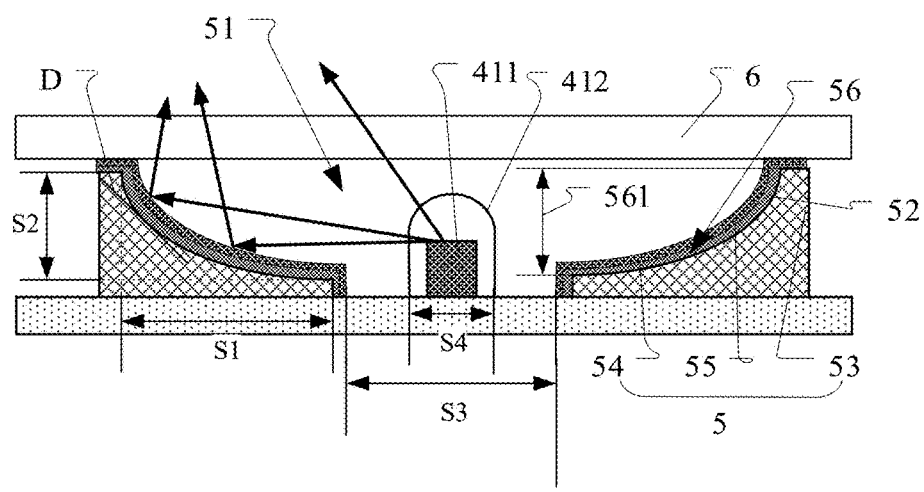
FIG. 8 is an enlarged view of a local region C of the backlight module shown in FIG. 6.

In some embodiments, as shown in FIG. 8, an enlarged view of a local region C of the backlight module shown in FIG. 6 is provided. The microstructure film layer 5 can include a foamed reflection layer 53, which is located on the circuit board 3 and is on the same side as the light-emitting unit 41 on the circuit board 3. A second opening hole 56 corresponding to the light-emitting unit group 4 is formed on the foamed reflection layer 53, and the light-emitting unit group 4 is located within the second opening hole 56 corresponding thereto. A sidewall of the second opening hole 56 can form the reflection wall 52. In some embodiments, the foamed reflection layer 53 can include a foamed material, in which multiple densely distributed bubbles are formed. The finer and denser the bubbles are, the higher the reflectivity of the foamed reflection layer is. The base material of the foamed reflection layer can be polyethylene terephthalate, and the foamed reflection layer can further include a master particle encapsulated in the base material. During the formation process of the foamed reflection layer, bubbles can be formed at the position where the master particle is located by pulling the base material. In some embodiments, the master particle can be materials such as titanium oxide, barium sulfate, calcium carbonate, etc. The foamed reflection layer can achieve a reflectivity of 98%.

In some embodiments, as shown in FIG. 8, the microstructure film layer can further include a first wavelength conversion layer 54, which can be configured to convert a wavelength of the light passing through it, and the first wavelength conversion layer 54 can conformally cover the sidewall of the second opening hole 56. The first wavelength conversion layer 54 can be a quantum dot layer or a fluorescence layer. The first wavelength conversion layer 54 can fine tune the color of the output light of the backlight module. For example, when the color of the output light of the backlight module is blue, the first wavelength conversion layer 54 can be configured to convert the blue light into the red light and the green light. For example, when the color of the output light of the backlight module is purple, the first wavelength conversion layer 54 can be configured to convert the blue light into the green light. As shown in FIG. 8, the first wavelength conversion layer 54 can also conformally cover an entire side of the foamed reflection layer 53 away from the circuit board 3.

In some embodiments, as shown in FIG. 8, the microstructure film layer can further include a transparent protection layer 55, which can conformally cover a side of the first wavelength conversion layer 54 away from the foamed reflection layer 53. The transparent protection layer 55 can be made of polyethylene terephthalate material. The transparent protection layer 55 can be used to protect the first wavelength conversion layer 54.

As shown by the arrow in FIG. 8, the light emitted by the light-emitting unit 41 can follow two kinds of transmission paths. Part of the light emitted by the light-emitting unit 41 can directly pass through the second wavelength conversion layer 6, to form white light emitted from the second wavelength conversion layer 6. Part of the light emitted by the light-emitting unit 41 can pass through the transparent protection layer 55 and the first wavelength conversion layer 54, be reflected on the sidewall of the second opening hole 56, and then incident into the second wavelength conversion layer 6 through the first wavelength conversion layer 54 and the transparent protection layer 55, to emit from the second wavelength conversion layer 6.

In some embodiments, as shown in FIG. 8, the light-emitting unit 41 can further include transparent glue 412, which forms an encapsulation on a side of the light-emitting chip 411 away from the circuit board 3, for fixing the light-emitting chip 411 onto the circuit board 3. The transparent glue 412 can provide physical protection for the light-emitting chip 411.

In some embodiments, as shown in FIG. 8, the second opening hole 56 can include a gradually-varied extension section 561, and an area of the opening hole on a side where the gradually-varied extension section 561 is away from the circuit board 3 is greater than an area of the opening hole on a side where the gradually-varied extension section 561 is close to the circuit board 3. That is, the area of the opening hole for the gradually-varied extension section 561 gradually increases from a side of the circuit board 3 to a side away from the circuit board 3. Such arrangement can enable the microstructure film layer 5 to have a larger light outlet, thereby reducing the risk of forming dark regions in non-light outlet regions. As shown in FIG. 8, a sidewall of the gradually-varied extension section 561 can form a curved surface, and a tangent D at any position on the sidewall of the gradually-varied extension section 561 can be located on a side of the sidewall of the gradually-varied extension section 561 facing towards the circuit board 3. Such arrangement can enable a slope of the sidewall of the gradually-varied extension section 561 at a position close to the light-emitting unit 41, in a direction parallel to the circuit board 3, to be smaller than a slope at a position away from the light-emitting unit 41. Therefore, in the direction parallel to the circuit board 3, high-intensity light at the position close to the light-emitting unit 41 can be reflected through the sidewall with a smaller slope to a position away from the light-emitting unit 41, and low-intensity light at the position away from the light-emitting unit 41 can be reflected through the sidewall with a larger slope, to emit out in a direction having a smaller angle with an extension direction of the first opening hole 51. In some embodiments, the extension direction of the first opening hole 51 can be a direction perpendicular to the circuit board 3. Such arrangement, on the one hand, can ensure that the light emitted by the light-emitting unit 41 mixes evenly within the first opening hole 51, thereby improving the uniformity of the light intensity at the outlet of the first opening hole 51, and on the other hand, such arrangement can improve the collimation of the light emitted by the light-emitting unit.

It should be noted that in some embodiments, since the first wavelength conversion layer 54 conformally covers on the sidewall of the second opening hole 56, and the transparent protection layer 55 conformally covers on a side of the first wavelength conversion layer 54 away from the foamed reflection layer 53, the first opening hole 51 and the second opening hole 56 can have the same shape.

In some embodiments, the foamed reflection layer 53 can be molded by a mold. When manufacturing the backlight module, the molded foamed reflection layer 53 can be assembled on a circuit board provided with a light-emitting unit.

As shown in FIGS. 6 and 8, the first opening hole 51 includes a first opening 511 on a side where the first opening hole is away from the circuit board 3 and a second opening 512 on a side where the first opening hole is close to the circuit board 3. An orthographic projection of the second opening 512 on circuit board 3 has a minimum size S3 in a direction passing through the opening's centroid, and an orthographic projection of the light-emitting unit 41 on the circuit board has a maximum size S4 in the direction passing through the opening's centroid, where S3 is greater than S4. As shown in FIG. 5, if the orthographic projection of the light-emitting unit 41 on the circuit board is a rectangle, the maximum size of the orthographic projection of the light-emitting unit 41 on the circuit board in the direction passing through the opening's centroid is a length of a diagonal of the orthographic projection of the light-emitting unit 41 on the circuit board. If the orthographic projection of the second opening 512 on the circuit board is a circle, the minimum size of the orthographic projection of the second opening 512 on the circuit board 3 in the direction passing through the opening's centroid is a diameter of the circle. In some embodiments, S3 is set slightly larger than S4, so that a certain assembly error can be reserved when assembling the foamed reflection layer 53, which facilitates the assembly of the foamed reflection layer 53. In some embodiments, S3-S4 can be 0.2 mm-0.6 mm, for example, S3-S4 can be 0.2 mm, 0.3 mm, 0.4 mm, 0.5 mm, 0.6 mm, etc.

It should be understood that in some embodiments, the first opening 511 can also be any one of polygonal, elliptical, or irregular shapes, and the second opening 512 can also be any one of polygonal, elliptical, or irregular shapes.

In some embodiments, as shown in FIGS. 6 and 8, the gradually-varied extension section 561 can include a third opening 5613 on a side where the gradually-varied extension section is away from the circuit board 3 and a fourth opening 5614 on a side where the gradually-varied extension section is close to the circuit board 3. A distance between the third opening 5613 and the fourth opening 5614 in a direction perpendicular to the circuit board is S2. A minimum distance between an edge of an orthographic projection of the third opening 5613 on the circuit board and an edge of an orthographic projection of the fourth opening 5614 on the circuit board in a first horizontal direction is S1. In some embodiments, the first horizontal direction is a direction parallel to the circuit board and passing through a centroid of the orthographic projection of the fourth opening 5614 on the circuit board. In some embodiments, a centroid of the orthographic projection of the third opening 5613 on the circuit board and the centroid of the orthographic projection of the fourth opening 5614 on the circuit board can coincide with each other, and the orthographic projections of the third opening 5613 and the fourth opening 5614 on the circuit board are both circles. Correspondingly, the minimum distance between the edge of the orthographic projection of the third opening 5613 on the circuit board and the edge of the orthographic projection of the fourth opening 5614 on the circuit board in the first horizontal direction is a width of a ring formed by the edge of the orthographic projection of the third opening 5613 on the circuit board and the edge of the orthographic projection of the fourth opening 5614 on the circuit board. In some embodiments, S1/S2 can be 1-4, for example, S1/S2 can be 1, 2, 3, 4, etc. In some embodiments, S2 can be 0.15 mm-0.3 mm, for example, S2 can be 0.15 mm, 0.18 mm, 0.2 mm, 0.25 mm, 0.3 mm.

It should be understood that in some embodiments, the third opening 5613 can also be any one of polygonal, elliptical, or irregular shapes, and the fourth opening 5614 can also be any one of polygonal, elliptical, or irregular shapes. For example, the orthographic projections of the third opening 5613 and the fourth opening 5614 on the circuit board can be a concentric square, with orthographic projections of one side edge of the third opening 5613 and one side edge of the fourth opening 5614 on the circuit board being able to be parallel to each other. Correspondingly, the minimum distance between the edge of the orthographic projection of the third opening 5613 on the circuit board and the edge of the orthographic projection of the fourth opening 5614 on the circuit board in the first horizontal direction is a distance between orthographic projections of the above parallel side edges on the substrate.

Figure 9:
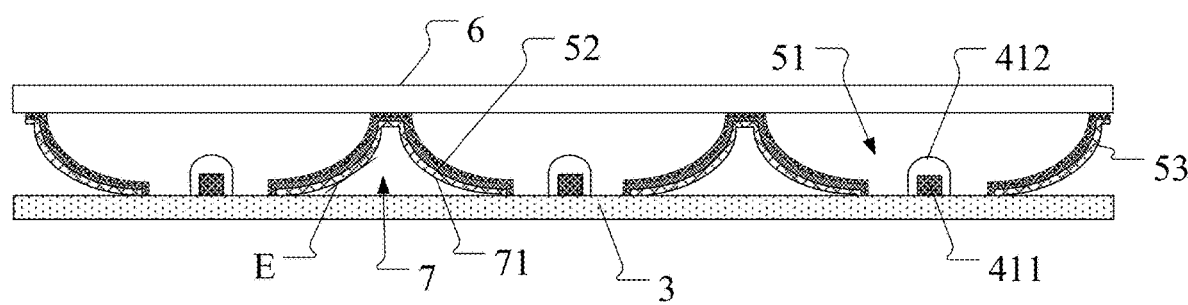
FIG. 9 is a schematic diagram of a structure of an example backlight module according to embodiments of the present disclosure.

In some embodiments, a thickness of the circuit board 3 is relatively thin. For example, the thickness of the circuit board 3 can be 0.12 mm, and a material of the circuit board 3 is relatively soft, which can easily lead to an uneven surface of the circuit board. The unevenness of the surface of the circuit board can affect the flatness of the microstructure film layer 5, which in turn affects the display effect. As shown in FIG. 9, a schematic diagram of a structure of an example backlight module according to embodiments of the present disclosure is provided. A groove 7 is further formed on a side of the foamed reflection layer 53 facing towards the circuit board 3. An area of a groove opening where the groove 7 is close to the circuit board 3 is greater than an area of a groove opening where the groove 7 is away from a side of the circuit board. That is, the groove opening of the groove 7 gradually decreases from a side of the circuit board 3 to a side away from the circuit board 3. An orthographic projection of a sidewall 71 of the groove 7 on the circuit board 3 intersects with an orthographic projection of a sidewall of the gradually-varied extension section 561 on the circuit board. Such arrangement can reduce a contact area between the microstructure film layer 5 and circuit board 3 while ensuring good support for the microstructure film layer 5, thereby avoiding the unevenness of the microstructure film layer 5 caused by the unevenness of the circuit board 3.

As shown in FIG. 9, the sidewall 71 of the groove 7 can form a curved surface, and a tangent E at any position on the sidewall 71 of the groove 7 can be located on a side of the sidewall 71 of the groove 7 facing towards the circuit board 3. The foamed reflection layer 53 of this structure has a certain elastic deformation ability, which can reduce the risk of damage to the foamed reflection layer. In addition, the groove 7 and the second opening hole 56 are arranged in the matching manner, which can enable the foamed reflection layer 53 to form a film layer with a relatively uniform thickness. In some embodiments, a maximum thickness of the foamed reflection layer between the sidewall 71 of the groove and the sidewall of the gradually-varied extension section is X, and a minimum thickness of the foamed reflection layer between the sidewall 71 of the groove and the sidewall of the gradually-varied extension section is Y, where (X−Y)/Y can be greater than or equal to 0 and less than or equal to 1.8. For example, (X−Y)/Y can be 0, 0.5, 1, 1.5, 1.8, etc.

Figure 10:
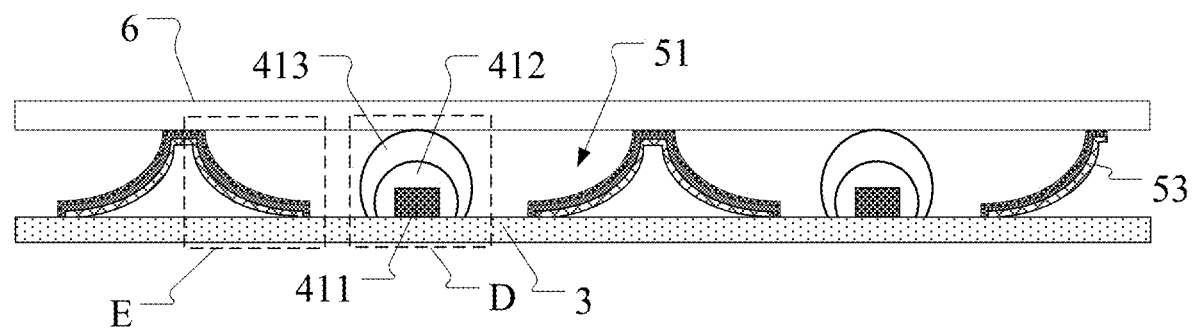
FIG. 10 is a schematic diagram of a structure of an example backlight module according to embodiments of the present disclosure.
Figure 11:
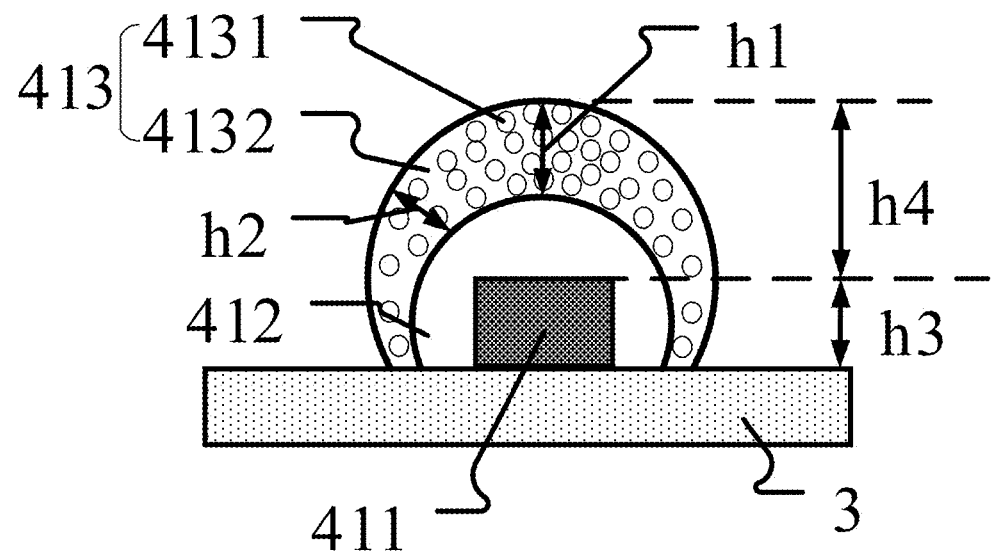
FIG. 11 is a locally enlarged view of a region D in FIG. 10.

As shown in FIGS. 10 and 11, FIG. 10 is a schematic diagram of a structure of an example backlight module according to embodiments of the present disclosure, and FIG. 11 is a locally enlarged view of a region D in FIG. 10. In some embodiments, the light-emitting unit 41 can further include a diffusion functional layer 413, which can form an encapsulation on a side of the transparent glue 412 away from the light-emitting chip 411. The diffusion functional layer 413 can be configured to diffuse the light passing through it. The diffusion functional layer 413 can include a diffusion base material layer 4132 and diffusion particles 4131 located within the diffusion base material layer 4132. The diffusion base material layer 4132 and the diffusion particles 4131 have different refractive indices, and the light incident into the diffusion functional layer 413 will continuously occur refraction, reflection, and scattering phenomena in two media with different refractive indices many times, so that the light incident into the diffusion functional layer 413 can emit out from different directions.

In some embodiments, as shown in FIGS. 10 and 11, a thickness h2 of the diffusion functional layer 413 on a side where the diffusion functional layer is close to the circuit board 3 is smaller than a thickness h1 of the diffusion functional layer on a side where the diffusion functional layer is away from the circuit board 3. Since the light emitted by the light-emitting chip 411 upwards has a higher intensity than the light emitted by the light-emitting chip 411 to its periphery, the present disclosure can increase the thickness of the diffusion functional layer on the side away from the circuit board 3, so that the thicker diffusion functional layer 413 can scatter the high-intensity light more fully, thereby improving the uniformity of the light mixing in the first opening hole 51. As shown in FIGS. 10 and 11, in the present disclosure, a concentration of diffusion particles 4131 in the diffusion functional layer 413 on the side close to the circuit board can be lower than a concentration of diffusion particles 4131 in the diffusion functional layer 413 on the side away from the circuit board 3. Such arrangement can enable the portion with a higher concentration of diffusion particles in the diffusion functional layer 413 to scatter the high-intensity light more fully, thereby improving the uniformity of the light mixing in the first opening hole 51. It should be understood that the arrangement of the diffusion functional layer 413 can also be applied to embodiments in FIGS. 5-9.

As shown in FIG. 10, the light-emitting unit 41 can be supported between the circuit board 3 and the second wavelength conversion layer 6. The light-emitting unit 41 can improve the stability of the second wavelength conversion layer 6 and the circuit board 3. It should be understood that in some embodiments, there can be a preset gap between the light-emitting unit 41 and the second wavelength conversion layer 6, and the light emitted by the light-emitting unit 41 can be scattered in the preset gap, thereby improving the uniformity of light mixing in the first opening hole 51.

As shown in FIG. 11, a height h3 of the light-emitting chip 411 can be 0.12 mm-0.15 mm, for example, h3 can be 0.12 mm, 0.13 mm, 0.15 mm. A distance h4 from the light-emitting chip 411 to the highest point of the diffusion functional layer 413 can be 0.25 mm-0.3 mm, for example, h4 can be 0.25 mm, 0.28 mm, or 0.3 mm.

Figure 12:
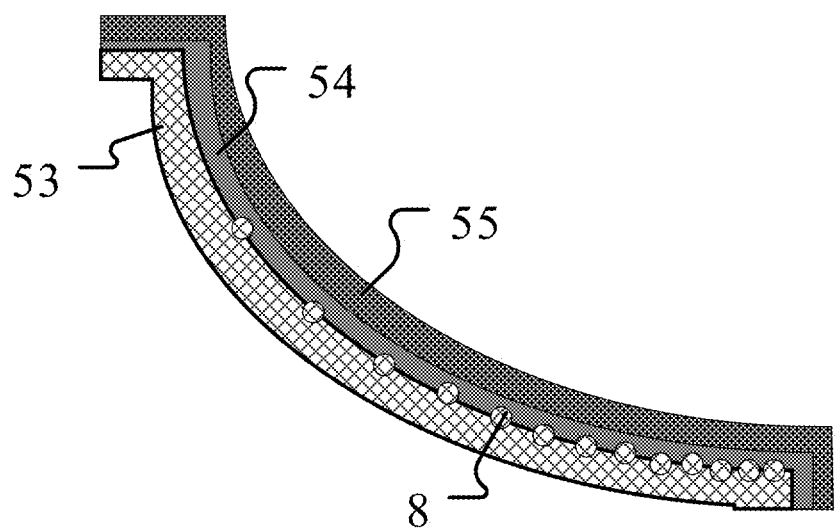
FIG. 12 is a locally enlarged view of a local region E in FIG. 10.

As shown in FIG. 12, a locally enlarged view of a local region E in FIG. 10 is provided. The microstructure film layer can further include multiple reflection particles 8, which can be distributed on at least a portion of a reflection surface of the reflection wall. The reflection particles 8 can be used for diffuse reflection of the light surrounding the reflection wall emitted by the light-emitting unit group 4. In some embodiments, in the direction parallel to the circuit board 3, on the same reflection wall surrounding one light-emitting unit group 4, a distribution density of the reflection particles 8 away from the light-emitting unit group 4 can be smaller than a distribution density of the reflection particles 8 close to the light-emitting unit group 4. Due to high-intensity of the light close to the light-emitting unit group and low-intensity of the light away from the light-emitting unit group, such arrangement can enable diffuse reflection of the high-intensity light through denser reflection particles, thereby improving the uniformity of the light mixing in the first opening hole 51. It should be understood that the arrangement of reflection particles 8 can also be applied to embodiments in FIGS. 5-9.

In some embodiments, the reflection particles 8 can be circular or elliptical, and can be integrally formed together with the foamed reflection layer 53 by using a mold. A material of the reflection particle can be the same as that of the foamed reflection layer 53. In some embodiments, the reflection particles 8 can also be formed on the reflection wall of the foamed reflection layer 53 through a coating process. Correspondingly, the material of the reflection particle can be one of titanium oxide, zinc oxide, magnesium oxide, magnesium carbonate, magnesium hydroxide, or silicon.

Figure 13:
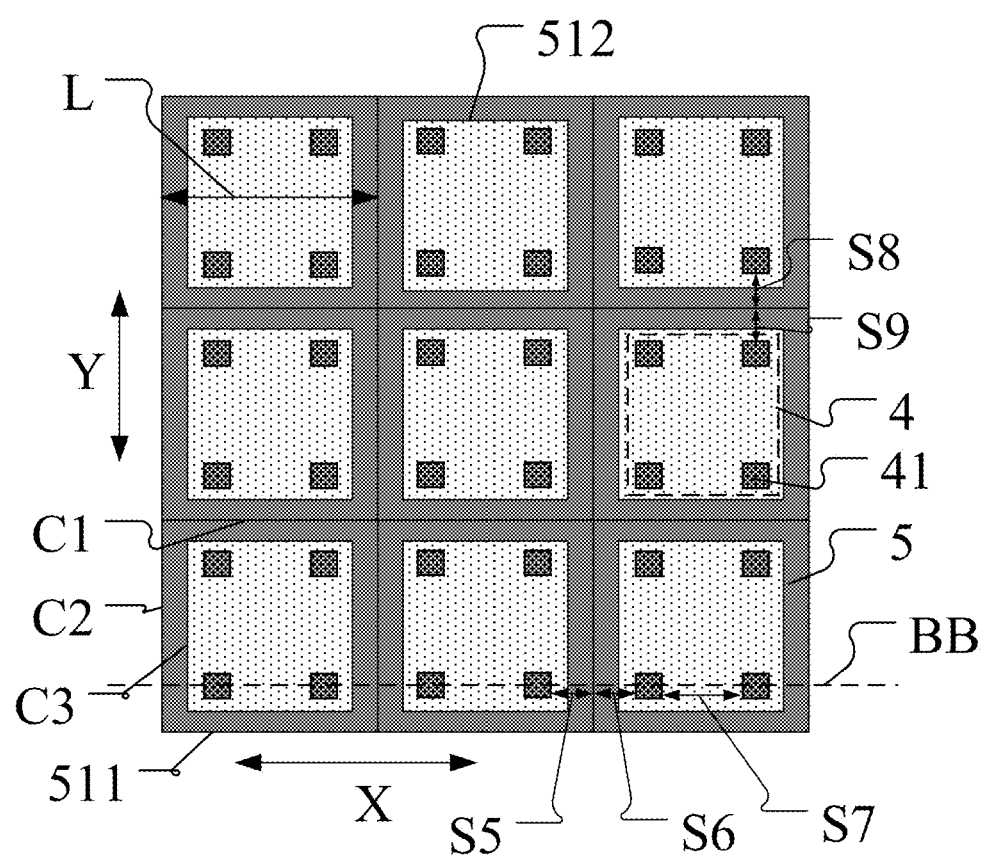
FIG. 13 is a front view of an example backlight module according to embodiments of the present disclosure.
Figure 14:
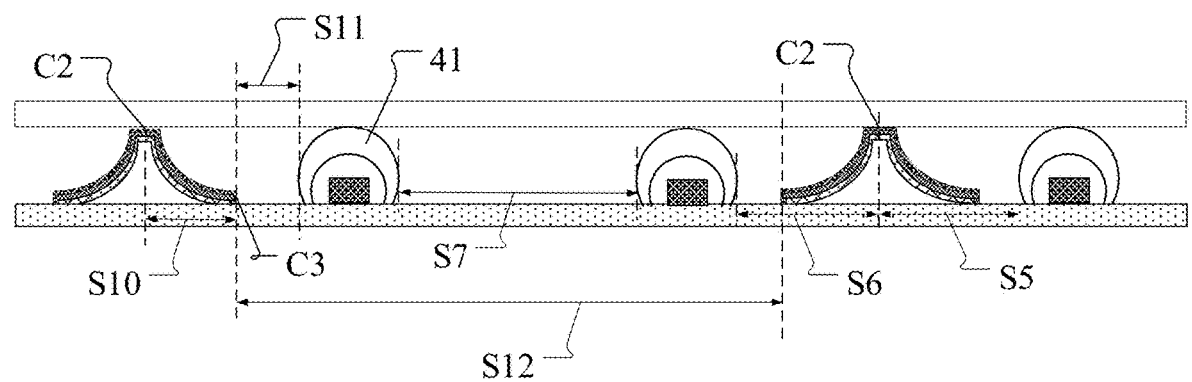
FIG. 14 is a partial sectional view of the backlight module shown in FIG. 13 along a dashed line BB.

In some embodiments, as shown in FIGS. 13 and 14, FIG. 13 is a front view of an example backlight module according to embodiments of the present disclosure, and FIG. 14 is a partial sectional view of the backlight module shown in FIG. 13 along a dashed line BB. The multiple light-emitting units 41 can be distributed in evenly spaced manner in an array in a first direction X and a second direction Y, where the first direction X intersects with the second direction Y. Each light-emitting unit group 4 can include four light-emitting units distributed in a two by two array. The first opening 511 can be of a quadrilateral shape, for example, the first opening 511 can be of a square shape, and the first opening 511 can include intersecting first side edge C1 and second side edge C2. The first side edge C1 is parallel to the first direction X, and the second side edge C2 is parallel to the second direction Y. The multiple first openings 511 can be distributed in an array along the first direction X and the second direction Y. Such arrangement can enable a small area of non-light outlet between adjacent first openings 511, thereby reducing the risk of forming dark regions in non-light outlet regions.

As shown in FIGS. 13 and 14, adjacent side edges of two adjacent first openings 511 in the first direction X can overlap with each other, and adjacent side edges of adjacent first openings 511 in the second direction Y can overlap with each other. That is, there is no gap between adjacent first openings 511. Such arrangement can greatly reduce the risk of forming dark regions in non-light outlet regions. In some embodiments, as shown in FIGS. 13 and 14, minimum distances S8 and S9, in the second direction Y, between the first side edge C1 and the light-emitting units 41 on both sides of the first side edge C1 can be equal, and minimum distances S5 and S6, in the first direction X, between the second side edge C2 and the light-emitting units 41 on both sides of the second side edge C2 can be equal. As shown in FIGS. 13 and 14, since the light-emitting units 41 are distributed in evenly spaced manner, a distance S7 between adjacent light-emitting units 41 in the first direction X in the same first opening hole 51 is equal to a sum of S5 and S6. As shown in FIG. 13, the second opening hole 512 can also be of a square shape, and the second opening hole 512 can include a third side edge C3. The third side edge C3 of the second opening hole 512 is parallel to the second side edge C2 of the first opening hole. A distance between the third side edge C3 and the second side edge C2 in the first direction X is S10, a distance between the third side edge C3 and its adjacent light-emitting units in the first direction X is S11, a distance between adjacent third side edges C3 located on both sides of the light-emitting unit group 4 in the first direction X is S12, a size of the first opening 511 in the first direction X is L, and S11 can be 0.3 mm, where $2*(S10+S11)+S7=L$, $S10=(L-S7)/2-S11$, $S12=S7+2*S11$, and $S7=L/2$. It should be noted that when the light-emitting unit group includes n*n light-emitting units distributed in an array, $S10=L/2n-S11$, and $S12=L(n-1)/n+2*S11$.

Figure 15:
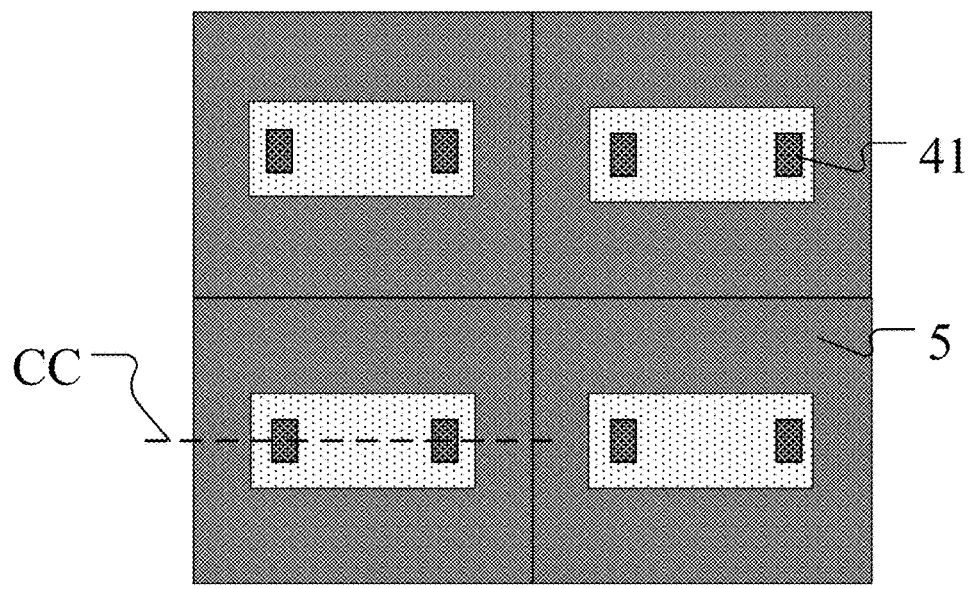
FIG. 15 is a front view of an example backlight module according to embodiments of the present disclosure.
Figure 16:
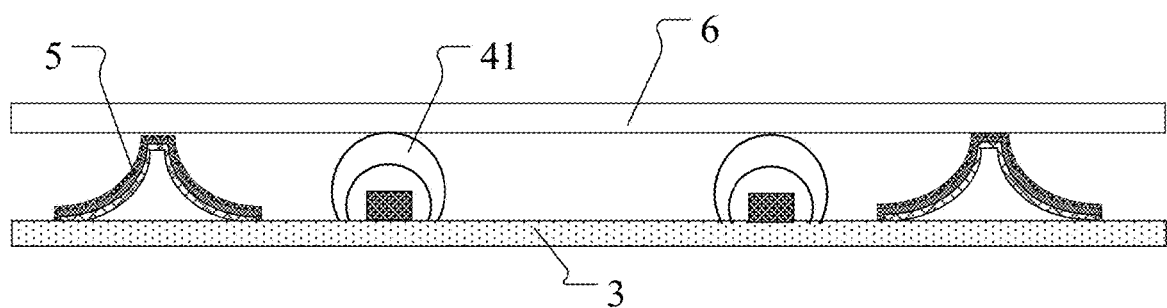
FIG. 16 is a sectional view of the backlight module shown in FIG. 15 along a dashed line CC.
Figure 17:
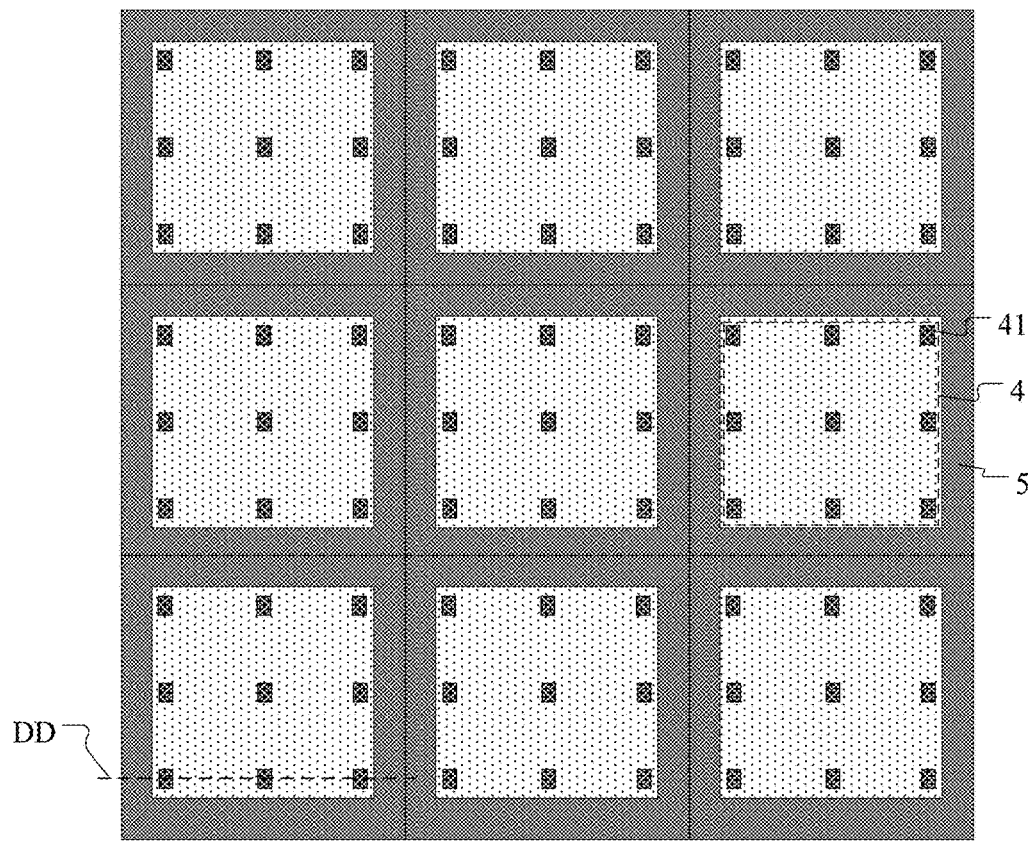
FIG. 17 is a front view of an example backlight module according to embodiments of the present disclosure.
Figure 18:
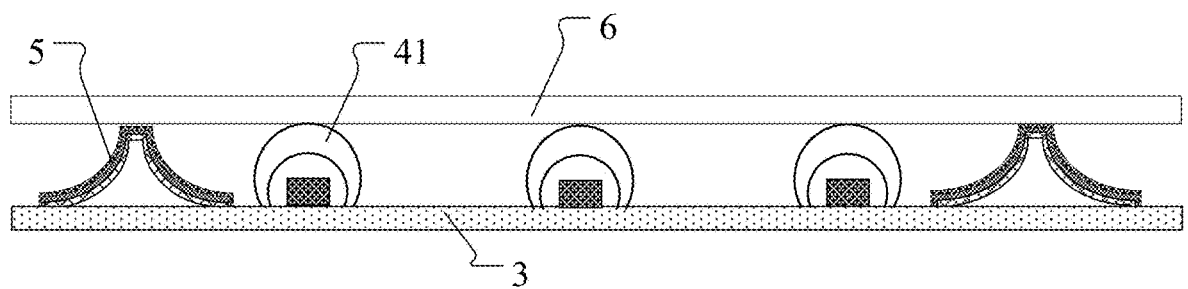
FIG. 18 is a sectional view of the backlight module shown in FIG. 17 along a dashed line DD.

It should be understood that in some embodiments, the light-emitting unit group can also include other quantities of light-emitting units. For example, as shown in FIGS. 15 and 16, FIG. 15 is a front view of an example backlight module according to embodiments of the present disclosure, and FIG. 16 is a sectional view of the backlight module shown in FIG. 15 along a dashed line CC. The light-emitting unit group 4 in the backlight module can include two light-emitting units 41. For example, as shown in FIGS. 17 and 18, FIG. 17 is a front view of an example backlight module according to embodiments of the present disclosure, and FIG. 18 is a sectional view of the backlight module shown in FIG. 17 along a dashed line DD. The light-emitting unit group 4 in the backlight module can include nine light-emitting units 41.

In addition, in the related art, the surface of lamp glue 16 is relatively flat, and the lamp glue 16 will be locally adsorbed with the wavelength conversion layer 17, resulting in occurrence of Newton ring on the light output side of the backlight module. In some embodiments, a contact surface between the microstructure film layer 5 and the second wavelength conversion layer 6 is relatively small, which can avoid the above Newton ring.

Figure 19:
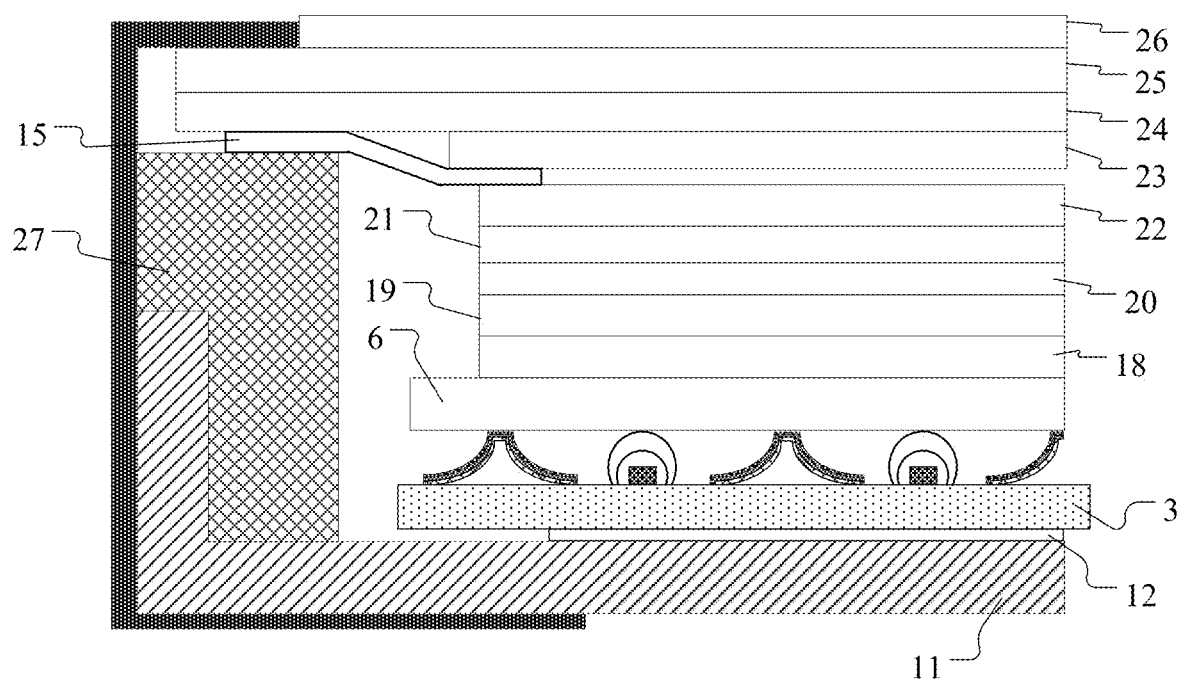
FIG. 19 is a schematic diagram of a structure of an example display device according to embodiments of the present disclosure.

Embodiments of the present disclosure also provide a display device, as shown in FIG. 19, which is a schematic diagram of a structure of an example display device according to embodiments of the present disclosure. The display device can include the backlight module and the display module mentioned above. As shown in FIG. 19, the backlight module can further include a backplane 11, double-sided glue 12, a homogenizing film 18, a homogenizing film 19, a homogenizing film 20, a homogenizing film 21, a prism film 22, mouth glue 15, and a glue frame 27. The display module can include a first polarizer 23, an array substrate 24, a color film 25, and a second polarizer 26. A liquid crystal layer can be arranged between the array substrate 24 and the color film 25. The display device can be a mobile phone, a tablet, a television, and other display devices.

After considering the specification and practicing of the invention disclosed herein, those skilled in the art will easily come up with other implementation solutions of the present disclosure. The present disclosure aims to cover any variations, uses, or adaptive changes of the present disclosure, which follow the general principles of the present disclosure and include common knowledge or commonly used technical means in the art that are not disclosed in the present disclosure. The specification and embodiments are only considered exemplary, and the true scope and spirit of the present disclosure are defined by the claims.

It should be understood that the present disclosure is not limited to the precise structures described above and shown in the drawings, and various modifications and changes can be made without departing from the scope. The scope of the present disclosure is limited only by the appended claims.

What is claimed is:

1. A backlight module, comprising:
   a circuit board;
   multiple light-emitting units arranged in an array on the circuit board, wherein the multiple light-emitting units form multiple light-emitting unit groups, and each of the light-emitting unit groups comprises at least one light-emitting unit; and
   a microstructure film layer located on the circuit board and on the same side as the light-emitting units on the circuit board, wherein first opening holes corresponding to the light-emitting unit groups are formed in the microstructure film layer, and at least one light-emitting unit group is located within a first opening hole corresponding thereto; and
   wherein the microstructure film layer comprises a reflection wall surrounding the first opening hole, and the reflection wall is configured to reflect light emitted by the light-emitting unit group surrounded by the reflection wall;
   wherein the microstructure film layer comprises a foamed reflection layer located on the circuit board and on the same side as the light-emitting units on the circuit board, and a groove is formed on a side of the foamed reflection layer facing towards the circuit board;
   wherein second opening holes corresponding to the light-emitting unit groups are formed on the foamed reflection layer, at least one light-emitting unit group is located within a second opening hole corresponding thereto, and a sidewall of the second opening hole forms the reflection wall;
   wherein the second opening hole comprises a gradually-varied extension section, a maximum thickness of the foamed reflection layer between a sidewall of the groove and a sidewall of the gradually-varied extension section is X, a minimum thickness of the foamed reflection layer between the sidewall of the groove and the sidewall of the gradually-varied extension section is Y, and $(X-Y)/Y$ is greater than or equal to 0 and less than or equal to 1.8.

2. The backlight module according to claim 1, wherein the microstructure film layer further comprises:
   a first wavelength conversion layer configured to convert a wavelength of light passing through the first wavelength conversion layer, and the first wavelength conversion layer conformally covers the sidewall of the second opening hole.

3. The backlight module according to claim 2, wherein the microstructure film layer further comprises:
   a transparent protection layer conformally covering a side of the first wavelength conversion layer away from the foamed reflection layer.

4. The backlight module according to claim 1, wherein an area of the second opening hole on a side where the gradually-varied extension section is away from the circuit board is greater than an area of the second opening hole on a side where the gradually-varied extension section is close to the circuit board.

5. The backlight module according to claim 4, wherein the sidewall of the gradually-varied extension section forms a curved surface, and a tangent at any position on the sidewall of the gradually-varied extension section is located on a side of the sidewall of the gradually-varied extension section facing towards the circuit board.

6. The backlight module according to claim 1, wherein an area of a groove opening where the groove is close to the circuit board is greater than an area of a groove opening where the groove is away from the circuit board; and
   an orthographic projection of the sidewall of the groove on the circuit board intersects with an orthographic projection of the sidewall of the gradually-varied extension section on the circuit board.

7. The backlight module according to claim 6, wherein the sidewall of the groove forms a curved surface, and a tangent at any position on the sidewall of the groove is located on a side of the sidewall of the groove facing towards the circuit board.

8. The backlight module according to claim 1, wherein the first opening hole comprises a first opening on a side where the first opening hole is away from the circuit board and a second opening on a side where the first opening hole is close to the circuit board, the first opening comprises any one of circular, polygonal, or elliptical shapes, and the second opening comprises any one of circular, polygonal, or elliptical shapes.

9. The backlight module according to claim 8, wherein the multiple light-emitting units are arranged in evenly spaced manner in an array in a first direction and a second direction, and the first direction intersects with the second direction; and
   wherein the first opening is of a quadrilateral shape, the first opening comprises a first side edge and a second side edge intersecting with each other, the first side edge is parallel to the first direction, the second side edge is parallel to the second direction, and multiple first openings are arranged in an array along the first direction and the second direction.

10. The backlight module according to claim 9, wherein adjacent side edges of two adjacent first openings in the first direction coincide with each other, and adjacent side edges of two adjacent first openings in the second direction coincide with each other.

11. The backlight module according to claim 4, wherein the gradually-varied extension section comprises a third opening on a side where the gradually-varied extension section is away from the circuit board and a fourth opening on a side where the gradually-varied extension section is close to the circuit board, a distance between the third opening and the fourth opening in a direction perpendicular to the circuit board is S2;
- a minimum distance between an edge of an orthographic projection of the third opening on the circuit board and an edge of an orthographic projection of the fourth opening on the circuit board in a first horizontal direction is S1, with the first horizontal direction passing through a centroid of the orthographic projection of the fourth opening on the circuit board; and
- wherein S1/S2 is greater than or equal to 1 and less than or equal to 4.

12. The backlight module according to claim 1, wherein the light-emitting unit comprises:
- a light-emitting chip; and
- a diffusion functional layer comprising a diffusion base material layer and diffusion particles located within the diffusion base material layer, wherein the diffusion functional layer forms an encapsulation on a side of the light-emitting chip away from the circuit board for diffusing light passing through the diffusion functional layer.

13. The backlight module according to claim 12, wherein a thickness of the diffusion functional layer on a side where the diffusion functional layer is close to the circuit board is smaller than a thickness of the diffusion functional layer on a side where the diffusion functional layer is away from the circuit board; and/or
- a concentration of the diffusion particles on a side where the diffusion functional layer is close to the circuit board is lower than a concentration of the diffusion particles on a side where the diffusion functional layer is away from the circuit board.

14. The backlight module according to claim 1, further comprising:
- a second wavelength conversion layer located on a side of the microstructure film layer away from the circuit board, and the light-emitting units are supported between the second wavelength conversion layer and the circuit board; or
- a second wavelength conversion layer located on a side of the microstructure film layer away from the circuit board, and there is a preset gap between the light-emitting units and the second wavelength conversion layer.

15. The backlight module according to claim 1, wherein the microstructure film layer further comprises:
- multiple reflection particles distributed on at least a portion of a reflection surface of the reflection wall, and configured for diffuse reflection of light surrounding the reflection wall emitted by the light-emitting unit group;
- wherein along a direction parallel to the circuit board and on the reflection wall surrounding one light-emitting unit group, a distribution density of the reflection particles away from the light-emitting unit group is smaller than a distribution density of the reflection particles close to the light-emitting unit group.

16. The backlight module according to claim 1, wherein the circuit board comprises:
- a control circuit configured to independently control luminous intensity of the light-emitting unit groups.

17. A display device comprising the backlight module according to claim 1.

* * * * *